United States Patent [19]

Held

[11] Patent Number: 4,579,808

[45] Date of Patent: Apr. 1, 1986

[54] IMAGEABLE COLLOIDAL METAL/MERCAPTAN ELEMENTS

[75] Inventor: Robert P. Held, Englishtown, N.J.

[73] Assignee: E. I. Du Pont de Nemours and Company, Wilmington, Del.

[21] Appl. No.: 635,349

[22] Filed: Jul. 27, 1984

[51] Int. Cl.$^4$ ................................................ G03C 5/24
[52] U.S. Cl. ........................................ 430/270; 430/275; 430/277; 430/321; 430/495; 430/524; 430/4; 430/269; 430/430; 430/428; 430/279
[58] Field of Search ............... 430/495, 524, 430, 428, 430/270, 277, 4, 269, 321, 275, 279

[56] References Cited

U.S. PATENT DOCUMENTS

| | | | |
|---|---|---|---|
| 4,029,509 | 6/1977 | Blake | 96/60 R |
| 4,047,956 | 9/1977 | Blake | 96/60 R |
| 4,052,211 | 10/1977 | Inoue et al. | 430/270 |
| 4,188,214 | 2/1980 | Kido et al. | 430/495 |
| 4,271,256 | 6/1981 | Kido et al. | 430/495 |

FOREIGN PATENT DOCUMENTS 57-111532  7/1982  Japan.

*Primary Examiner*—Won H. Louie

[57] ABSTRACT

Photosensitive element for forming a lithographic negative which comprises a support bearing a dry photosensitive layer consisting essentially of an intimate mixture of colloidal metal particles, e.g., silver, etc., colloid binder, free radical producing compound, and mercaptan compound, e.g., 2-mercaptobenzoxazole. A two layer photosensitive element embodiment comprises on a support a lower dry colloidal layer having dispersed colloidal metal particles and an upper dry layer consisting essentially of free-radical producing compound and a mercaptan compound. The elements are exposed imagewise, bleached, rinsed, and optionally fixed.

17 Claims, No Drawings

IMAGEABLE COLLOIDAL METAL/MERCAPTAN ELEMENTS

DESCRIPTION

TECHNICAL FIELD

This invention relates to a photosensitive element for the preparation of lithographic negatives. More particularly this invention relates to one or two layer photosensitive elements having a dry layer having dispersed therein fine colloidal metal particles and intimately mixed therewith or in a separate layer a compound capable of producing free-radicals under action of actinic radiation and a mercaptan compound. This invention also relates to a process for preparing a lithographic negative from the photosensitive elements.

BACKGROUND ART

In the photomechanical trade, a mask containing an image that is opaque to actinic radiation is used in preparing a printing plate of some kind, e.g., letterpress, lithographic, etc. The mask is used as a phototool in exposing a layer of photosensitive resist-forming material present on a metal or plastic plate or a photopolymer printing plate matrix. After the exposure the printing plate is formed by etching or liquid development depending on the system present. The image in the mask must be of the highest possible contrast, e.g., completely black in the image areas, and completely transparent (free from fog) in the unexposed areas. Silver halide film known as "litho" film is used to prepare the mask. When a litho film is exposed through a halftone screen and developed, it contains an image comprised of dots. The dots correspond to the areas of the film under the transparent areas of the halftone screen and are comprised of exposed and developed material. Silver halide films are expensive and require special red light handling.

It is therefore desirable to provide a photosensitive element of good processing latitude for forming a lithographic negative of high quality which can use a low coating weight of silver or other metals that form insoluble sulfides. It is also desirable that said photosensitive element, in one or two layer embodiments, be capable of forming the lithographic negative image by diffusion reaction rather than solvent development.

DISCLOSURE OF THE INVENTION

In accordance with this invention there is provided a photosensitive element for forming a lithographic negative which comprises a support bearing a dry photosensitive layer consisting essentially of an intimate mixture of (a) colloidal metal particles taken from the group consisting of silver, gold, palladium, cadmium, nickel, copper, and zinc, (b) a colloid binder, (c) compound capable of producing free-radicals under the action of actinic radiation, and (d) a mercaptan compound.

In accordance with another embodiment of this invention there is provided a two-layer photosensitive element for forming a lithographic negative which comprises a support bearing in order (a) a dry colloidal layer having dispersed therein fine colloidal metal particles taken from the group consisting of silver, gold, palladium, cadmium, nickel, copper and zinc, and (b) a dry layer consisting essentially of a compound capable of producing free-radicals under the action of actinic radiation and a mercaptan compound.

In accordance with still another embodiment of this invention there is provided a process for preparing a lithographic negative which comprises (a) exposing imagewise to actinic radiation a photosensitive element which comprises a support bearing in order (1) a dry colloidal layer having dispersed therein fine colloidal metal particles taken from the group consisting of silver, gold, palladium, cadmium, nickel, copper, and zinc, and (2) a dry layer consisting essentially of a compound capable of producing free-radicals under the action of actinic radiation and a mercaptan compound;

(b) treating the exposed element with a bleach solution which diffuses through the unexposed areas and dissolves the metal in the unexposed areas;

(c) rinsing the treated element to remove excess bleach; and (d) optionally, fixing the rinsed element.

The photosensitive element of this invention is useful in one or two layer embodiments. The element having a single photosensitive layer comprises a support bearing a dry layer 0.0001 to 0.10 inch thick (0.0025 to 2.54 mm), preferably 0.0002 to 0.001 inch (0.0005 to 0.0254 mm) of an intimate mixture of four essential components is described above. The colloidal metal particles (a) generally having an average diameter range of 1 $\mu$m to 500 $\mu$m are taken from the group consisting of silver, gold, palladium, cadmium, nickel, copper, zinc, etc. The colloid binder (b) provides support for the metal particles as well as the other components present in the layer. Suitable colloid materials include: gelatin, polyvinyl alcohol casein, cellulosic derivatives, partially hydrolyzed polyvinyl acetates, polyvinyl ethers, acetate containing a large number of extralinear —CH$_2$-CH—OH— groups, hydrolyzed interpolymers of vinyl acetate, etc. Also present is a compound capable of producing free-radicals under the action of actinic radiation (c), e.g., 2,4,5-triacryl imidazolyl dimer compound of the type described by Cescon in U.S. Pat. No. 3,784,557, and Dessauer in U.S. Pat. No. 4,311,783, the disclosures of which are incorporated by reference, Michler's ketone, benzophenone, and anthraquinones, e.g., 9-10-anthraquinone, etc., ketoldonyl compounds of Plambeck U.S. Pat. No. 2,760,863, and the acyloin ethers, e.g., benzoin methyl and ethyl ethers, etc., and mixtures thereof. In conjunction with the above-described components is present a mercaptan compound (d), e.g., 2-mercaptobenzoxazole, 1-phenyl-2-tetrazoline-5-thione, 2-mercaptobenzothiazole, 2-mercaptobenzoxazole, 2-mercaptobenzotetrazole, phenylmercaptotetrazole, etc. Optional ingredients that can be present in the photosensitive layer include one or more plasticizers. Examples of plasticizers include: a mixture of triethylene glycol dicaprate and triethylene glycol dicaprylate, phthalate esters; dioctyl phthalate; phosphate esters, e.g., dicresyl phosphate, etc.

The above components are present in the photosensitive layer in the following percentages by weight based on the dry weight of the layer:

(a) Metal particles, 10 to 90%, preferably 20 to 60%, (B) Colloid binder, 10 to 90%, preferably 25 to 60, (c) Free-radical producer, 0.5 to 10%, preferably 1 to 5%, (d) Mercaptan, 0.1 to 10%, preferably 0.2 to 5%, (e) Plasticizer, 0 to 50%, preferably 10 to 25%, The photosensitive layer is coated or laminated onto a suitable support, e.g., films composed of high polymers which are cast as films from molten polymer, such as polyamides, e.g., polyhexamethylene sebacamide, polyhexamethylene adipamide, polyolefins, e.g., polypropylene, polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088, Alles, U.S. Pat. No. 2,779,684 and Rawlins U.S. Pat. No. 3,433,950, with or without the surface coating described in the former patent. The support may have a resin "sub" or other layer thereon which may or may not be soluble and which for purposes of this invention is considered part of the support. Where the particular application does not require that the base support be transparent, the photopolymerizable layers may usefully be present on an opaque support, e.g., paper, especially water-proof photographic paper; thin metal sheets, especially aluminum and copper sheets, cardboard, etc. The thickness of the support can range from 0.0005 to 0.02 inch (0.013 to 0.5 mm) which includes any subbing layer that may be present.

The two layer photosensitive layer present in order on the above-described support are dry layer (a) colloidal layer having dispersed therein fine colloidal metal particles and dry layer (b) consisting essentially of at least one compound capable of producing free-radicals under the action of actinic radiation and at least one mercaptan compound. The components in the layers are the same as those described above including plasticizer. Layer (a) has a thickness in the range of 0.0001 to 0.01 inch (0.0025 to 0.254 mm), preferably 0.0002 to 0.001 inch (0.005 to 0.254 mm). Layer (b) has a thickness in the range of 0.00005 to 0.005 inch (0.0013 to 0.127 mm), preferably 0.0001 to 0.001 inch (0.0025 to 0.0254 mm).

The elements can be prepared as described in the examples below although the invention is not limited to the specific procedures. The single layer element, for examples can be prepared by premixing the free-radical producing compound, mercaptan, solvent, plasticizer and any other optional ingredients, and then adding the mixture to the colloid-metal particles. The mixture can then be coated on the support, e.g., by means of a doctor knife or other coating means known to those skilled in the art. The layer is then dried. In the preparation of the two layer element, a colloidal silver dispersion in colloid binder is prepared, for example, as described in Example 1 wherein three solutions are prepared; I colloid binder, II silver nitrate and III silver reduction. Solution II is added to Solution I with stirring at 40° C. After holding, e.g., for 15 minutes, Solution III is added over a period of time, e.g., 60 seconds. The final mixture is then digested, e.g., at 40° C. for 30 minutes. A composition of the remaining ingredients was prepared from an aqueous phase, e.g., colloid, dispersing agent and water, and an organic phase, e.g., plasticizer, free-radical producing compound, mercaptan and organic solvent. The two phases are mixed thoroughly, e.g., for about 15 minutes. The colloidal silver dispersion is then coated on the support, e.g., with a doctor knife or other coating means known to those skilled in the art. After drying, the colloidal silver layer, and the composition containing the remaining ingredients is coated contiguous to the dry colloidal silver dispersion and dried. As shown in Example 3, different compositions may be utilized, e.g., utilizing different colloidal metal particles, colloid binder dispersion and colloid aqueous phase and sensitizer and mercaptan-containing organic phase. The preparation of the phases is within the knowledge of a skilled artisan.

The photosensitive elements, described above, are imagewise exposed, e.g., for 5 seconds to 10 minutes, through a suitable phototool, mask, or transparency, e.g., a halftone dot image, to a source of actinic radiation. The actinic radiation sources must transmit radiation in the actinic region that the free-radical producing compound (sensitizer) is sensitive. Suitable sources include those rich in ultraviolet radiation, e.g., those disclosed in Plambeck U.S. Pat. No. 4,157,407 and Haney and Lott U.S. Pat. No. 4,411,980, the disclosures of which are incorporated by reference.

The exposed element is then treated, e.g., for 5 seconds to 10 minutes, with a bleach solution which diffuses through the unexposed areas and dissolves metallic silver in these areas forming a negative image of silver mercaptide. A suitable bleaching solution is an aqueous solution of $K_2CO_3$, e.g., 15% by weight and $K_3Fe(CN)_6$, e.g., 1.5% by weight. Other bleaching agents are strong inorganic acids, cupric nitrate, the dichromates, etc. After bleaching the element is rinsed with or in water to remove excess bleach, followed by optionally fixing the rinsed element to eliminate any possible background haze in nonimage areas. The fixing agent is a standard silver halide fixer solution, e.g., aqueous solium thiosulfate solution, e.g., at 45° C. A water rinse usually follows the fixing step.

When silver metal particles are replaced by other metals, e.g., copper powder as illustrated in Example 3, the bleach treatment step is replaced with an etching step, e.g., 42° Baumé ferric chloride solution, followed by a water rinse. The etchant passes through the colloid layer in areas that are unexposed. Other etchants useful with the metals described above can be determined by those skilled in the art. A preferred embodiment of the invention is described in Example 1 below.

INDUSTRIAL APPLICABILITY

The one or two-layer photosensitive elements are useful for the preparation of lithographic negatives. High quality halftone dots are obtained. The preferred element is a two-layer photosensitive element which comprises or support bearing a lower dry layer of a colloid or mixture of colloids having dispersed therein fine colloidal metal particles, e.g., silver, and an upper dry layer consisting essentially of a compound capable of producing free-radicals under the action of actinic radiation and a mercaptan compound as defined above. While not being limited to the specific reactions involved, it is believed that upon imagewise exposure of the element through an image, the free-radical sensitizer reacts with the mercaptan compound to yield radicals in the exposed areas. The radicals formed diffuse through to the colloidal metal and produce an insoluble metal mercaptide. The exposed element is bleached and during the bleaching treatment the bleach diffuses through the lower colloid layer preferentially dissolving the metallic metal in the unexposed areas forming a high quality negative image of metal mercaptide. It may be preferably to fix the image, i.e., remove background haze that may be present in the nonimage areas. Depending on the particular composition, an etchant may be used to develop a negative image. The lithographic film, e.g., containing halftone dots, is useful in lithographic plate making.

EXAMPLES

The following examples illustrate the invention wherein the percentages are by weight.

EXAMPLE 1

A colloidal silver dispersion in gelatin as the colloid binder was prepared from the following solutions:

I. Colloid Binder (gelatin) Solution a. Disperse 96 g of bone gelatin in 1,680 ml of cold water.
b. Stir dispersion for 15 minutes, and then heat to 40° C. until all of the gelatin is dissolved.
c. Hold the heated dispersion for an additional 15 minutes, and then add 7 ml of 3N NaOH and adjust pH to 9.0.

II. Silver Nitrate Solution a. Dissolve 14.5 g of strontium nitrate in 132 ml cold water.
b. Add 150 ml of 3N silver nitrate and stir at 40° C.

III. Silver Reduction Solution 330 ml water
62.5 sodium sulfite (anhydr.)
12.75 g hydroquinone.

The colloidal silver dispersion in gelatin was made by:

A. Adding Solution II to Solution I with stirring at 40° C., and then holding for 15 minutes.
B. Adding Solution III to the above mixture described in A over a 60 second period of time.
C. Digesting this final mixture at 40° C. for 30 minutes.
D. Analysis:
pH = 5.26
solids = 11.2%

A composition containing a free radical forming species and a mercaptan was prepared from the following ingredients:

| Ingredients | Amt. (g) |
| --- | --- |
| I. Aqueous Phase: | |
| Gelatin | 18.0 |
| Polyvinylpyrrolidone (40% in water) | 0.6 |
| Dispersing agent, a phosphate ester in acid form (Triton ® QS-44) Rohm and Haas Co. | 1.0 |
| Saponin | 3.0 |
| Water | 230.0 |
| II. Organic Phase: | |
| Triethylene glycol dicaprate and triethylene glycol dicaprylate (Plasticizer SC ®) | 10.0 |
| 2(o-chlorophenyl)-4,5-diphenylimidazolyl dimer (o-CL-HABI) | 6.0 |
| 2-mercaptobenzoxazole (2-MBO) | 3.0 |
| Methylene chloride | 30.0 |

These two phases were then thoroughly mixed for about 15 minutes.

The colloidal silver dispersion in gelatin was then coated with a 0.004 inch (0.10 mm) doctor knife on a 0.004 (0.10 mm) biaxially oriented and heat set polyethylene terephthalate film support which had just been coated with a resin sub layer made from viylidene chloride/alkyl acrylate/itaconic acid copolymer mixed with an alkyl acrylate and/or methacrylic polymer as described by Rawlins in U.S. Pat. No. 3,433,950 over which had been coated a thin anchoring substratum of gelatin (about 0.5 mg/dm$^2$). The colloidal silver layer was dried and the mixture containing the free radical forming species (o-Cl-HABI) and a mercaptan (2-MBO) was coated contiguous thereto using a 0.004 inch (0.10 mm) doctor knife and dried.

A sample of this film was then exposed through a test target image which is comprised of a $^2\sqrt{2}$ stepwedge and a series of half-tone dots representing the whole spectrum of achievable dot images. The exposure was made to a 4 kw Pulsed Xenon Arc source at 18 inches (45.72 cm) for 6 minutes.

The exposed sample was then processed for 7 minutes in a ferricyanide bleach solution (Kodak ® Trimask Bleach) made up as follows:
Bleach—400 ml
Water—1600 ml
$K_2CO_3$—300 g After this step, the processed film was washed with water and then fixed in a standard photographic silver halide fixer solution (aqueous sodium thiosulfate solution) for 2 minutes at 45° C. followed by a water rinse. The fixer removed the background haze in the nonimage areas. An excellent, dense, black image was obtained with sharp dots in all areas.

EXAMPLE 2

A single layer element containing metal particles, binder, free-radical producing compound (sensitizer), and a mercaptan was prepared from the following ingredients:

| Ingredients | Amt. (g) |
| --- | --- |
| a. Gelatin-colloidal silver (Example 1) | 100.0 |
| b. Plasticizer (organic phase, (Example 1) | 5.0 |
| c. o-Cl-HABI | 1.5 |
| d. 2-MBO | 0.8 |
| e. Methylene chloride | 15.0 |
| f. Methyl alcohol | 3.0 |

Ingredients b–f were premixed and then added to ingredient a. This mixture was then coated using a 0.004 inch (0.10 mm) doctor knife on a polyethylene terephthalate film support as described in Example 1. A sample from the dried coating was exposed as described in Example 1 and the exposed element was developed by bleaching for 1 minute in the following bleach solution:
aqueous solution of
15% $K_2CO_3$
1.5% $K_3Fe(CN)_6$ The developed sample was then rinsed in water and a black, negative image of the target resulted. Although the image did not have as high a quality as that of Example 1, the image was considered acceptable and demonstrates the utility of a single layer coating as an embodiment of this invention.

EXAMPLE 3

To demonstrate the utility of another species of metal powder within the ambit of this invention, the following dispersion was prepared.

| Ingredients | Amt. (g) |
| --- | --- |
| Polyvinyl alcohol soln. (10% in water) | 77.0 |
| Copper powder (U.S. Bronze C112) | 35.0 |
| Anionic polyelectrolyte dispersant, Stockhausen Polystabil V6596 (VZ) distributed by Mobay Chemicals, Pittsburgh, PA | 0.5 |
| Distilled water | 23 ml |

This mixture was ball-milled for about 48 hours and coated on a polyethylene terephthalate film support as described in Example 1. After drying, a coating of the following ingredients was applied thereon:

| Ingredients | Amt. (g) |
| --- | --- |
| Aqueous Phase: | |
| Water | 230.0 |
| Gelatin | 18.0 |
| Polyvinylpyrrolidone (40% in water) | 5.0 |
| Dispersing agent (aqueous phase, Example 1) | 1.0 |
| Saponin | 3.0 |
| Fluorinated hydrocarbon (10% in water)[1] | 3 cc |
| Organic Phase: | |
| 4,4'-bisdimethylamino-benzophenone (Michler's ketone) | 0.4 |
| Benzophenone | 1.5 |
| 1-phenyl-2-tetrazoline-5-thione | 0.4 |
| Plasticizer (organic phase, Example 1) | 10.0 |
| Methylene chloride | 15.00 |

(1) 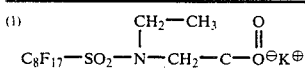

The two phases were blended thoroughly for 5 minutes and coated contiguous to the copper containing layer using a 0.004 inch (0.10 mm) doctor knife and dried. A sample of the dried film was exposed as described in Example 1 and developed by etching 30 seconds in a 42° Baumé ferric chloride solution followed by a water rinse. A negative copper image of the original was achieved.

I claim:

1. A photosensitive element for forming a lithographic negative by diffusion reaction which comprises a support bearing a dry photosensitive layer consisting essentially of an intimate mixture of (a) colloidal metal particles taken from the group consisting of silver, gold, palladium, cadmium, nickel, copper and zinc, (b) a colloid binder, (c) compound capable of producing free-radicals under the action of actinic radiation, and (d) a mercaptan compound.

2. A photosensitive element according to claim 1 wherein the colloidal metal particles (a) are silver.

3. A photosensitive element according to claim 1 wherein the colloid binder (b) is gelatin.

4. A photosensitive element according to claim 1 wherein the free-radical producing compound (c) is a 2,4,5-triaryl imidazolyl dimer compound.

5. A photosensitive element according to claim 1 wherein the mercaptan compound (d) is 2-mercaptobenzoxazole.

6. A photosensitive element according to claim 1 wherein the intimate mixture contains a plasticizer.

7. A photosensitive element according to claim 6 wherein the plasticizer is a mixture of triethylene glycol dicaprate and triethylene glycol dicaprylate.

8. A two-layer photosensitive element for forming a lithographic negative by diffusion reaction which comprises a support bearing in order (a) a dry colloidal layer having dispersed therein fine colloidal metal particles taken from the group consisting of silver, gold, palladium, cadmium, nickel, copper and zinc, and (b) a dry layer consisting essentially of a colloid binder, a compound capable of producing free-radicals under the action of actinic radiation and a mercaptan compound.

9. A photosensitive element according to claim 8 wherein in layer (a) the colloidal metal particles are silver and the colloid binder is gelatin.

10. A photosensitive element according to claim 9 wherein in layer (b) the free-radical producing compound is a 2,4,5-triphenyl imidazolyl dimer compound and the mercaptan compound is 2-mercaptobenzoxazole.

11. A photosensitive element according to claim 8 wherein in layer (a) the colloidal metal particles are copper and the colloid binder is polyvinyl alcohol.

12. A photosensitive element according to claim 11 wherein in layer (b) the free radical producing compound is Michler's ketone and the mercaptan compound is 1-phenyl-2-tetrazoline-5-thione.

13. A process for preparing a lithographic negative which comprises
    (a) exposing imagewise to actinic radiation a photosensitive element which comprises a support bearing in order (1) a dry colloidal layer having dispersed therein fine colloidal metal particles taken from the group consisting of silver, gold, palladium, cadmium, nickel, copper, and zinc, and (2) a dry layer consisting essentially of a colloid binder, a compound capable of producing free-radicals under the action of actinic radiation and a mercaptan compound;
    (b) treating the exposed element with a bleach solution which diffuses through the unexposed areas and dissolves the metal in the unexposed areas;
    (c) rinsing the treated element to remove excess bleach; and
    (d) optionally, fixing the rinsed element.

14. A process according to claim 13 wherein the photosensitive element is a supported single layer element wherein the colloid, fine colloidal metal particles, compound capable of producing free-radical under the action of actinic radiation and mercaptan compound are present in intimate mixture.

15. A process according to claim 13 wherein in layer (1) the colloidal metal particles are silver and the colloid is gelatin.

16. A process according to claim 15 wherein in layer (2) the free-radical producing compound is a 2,4,5-triphenyl imidazolyl dimer compound and the mercaptan compound is 2-mercaptobenzoxazole.

17. A process according to claim 13 wherein layer (1) the colloidal metal particles are copper and the colloid is polyvinyl alcohol and in layer (2) the free radical producing compound is Michler's ketone and the mercaptan compound is 1-phenyl-2-tetrazoline-5-thione, and after imagewise exposure the exposed element is treated in place of the bleach with a ferric chloride etching solution.

* * * * *